(12) United States Patent
Fornage

(10) Patent No.: US 9,105,765 B2
(45) Date of Patent: Aug. 11, 2015

(54) SMART JUNCTION BOX FOR A PHOTOVOLTAIC SYSTEM

(71) Applicant: Enphase Energy, Inc., Petaluma, CA (US)

(72) Inventor: Martin Fornage, Petaluma, CA (US)

(73) Assignee: Enphase Energy, Inc., Petaluma, CA (US)

( * ) Notice: Subject to any disclaimer, the term of this patent is extended or adjusted under 35 U.S.C. 154(b) by 0 days.

(21) Appl. No.: 14/104,536

(22) Filed: Dec. 12, 2013

(65) Prior Publication Data

US 2014/0168835 A1    Jun. 19, 2014

Related U.S. Application Data

(60) Provisional application No. 61/738,758, filed on Dec. 18, 2012.

(51) Int. Cl.
| | | |
|---|---|---|
| H02H 3/00 | (2006.01) | |
| H01L 31/02 | (2006.01) | |
| H02H 7/20 | (2006.01) | |
| H01M 10/44 | (2006.01) | |

(52) U.S. Cl.
CPC .......... *H01L 31/02008* (2013.01); *H02H 7/20* (2013.01)

(58) Field of Classification Search
USPC .......................................................... 361/82
See application file for complete search history.

(56) References Cited

U.S. PATENT DOCUMENTS

| | | | |
|---|---|---|---|
| 5,075,813 A | * | 12/1991 | Takabayashi ................. 361/84 |
| 5,726,505 A | * | 3/1998 | Yamada et al. ............. 307/127 |
| 6,624,609 B2 | | 9/2003 | Allen |
| 7,925,552 B2 | | 4/2011 | Tarbell et al. |
| 8,248,804 B2 | | 8/2012 | Han et al. |
| 8,289,183 B1 | | 10/2012 | Foss |
| 8,290,207 B2 | | 10/2012 | Lai |
| 8,294,451 B2 | | 10/2012 | Hasenfus |
| 8,324,921 B2 | | 12/2012 | Adest et al. |

(Continued)

FOREIGN PATENT DOCUMENTS

| | | |
|---|---|---|
| EP | 1931690 A2 | 6/2008 |
| EP | 2105856 A1 | 9/2009 |

(Continued)

OTHER PUBLICATIONS

PCT International Search Report and Written Opinion for PCT/US2013/075324 dated Apr. 3, 2014.

(Continued)

*Primary Examiner* — Dharti Patel
(74) *Attorney, Agent, or Firm* — Moser Taboada

(57) ABSTRACT

A method and apparatus for a smart junction box including: a first set of switches connected across input terminals adapted for connection to output terminals of a plurality of photovoltaic (PV) modules, a plurality of diodes connected across input terminals of each respective switch in the first set of switches, at least one reverse current detection device on at least one output terminal of the smart junction box, a second set of switches to selectively disconnect and short circuit output terminals of the smart junction box when a reverse current is detected, and wherein at least one switch of the second set of switches is located across the output terminals, a controller for controlling the first and second set of switches.

20 Claims, 7 Drawing Sheets

(56) References Cited

U.S. PATENT DOCUMENTS

| | | |
|---|---|---|
| 8,410,950 B2 | 4/2013 | Takehara et al. |
| 8,604,404 B1 | 12/2013 | Linderman |
| 8,645,089 B2 | 2/2014 | Shiotani et al. |
| 8,710,351 B2 | 4/2014 | Robbins |
| 8,749,934 B2 * | 6/2014 | Hackenberg .................. 361/84 |
| 8,816,535 B2 | 8/2014 | Adest et al. |
| 8,823,218 B2 | 9/2014 | Hadar et al. |
| 8,854,193 B2 | 10/2014 | Makhota et al. |
| 8,859,884 B2 | 10/2014 | Dunton et al. |
| 8,878,563 B2 | 11/2014 | Robbins |
| 2003/0116154 A1 | 6/2003 | Butler et al. |
| 2008/0084178 A1 | 4/2008 | Dowd et al. |
| 2009/0325003 A1 * | 12/2009 | Aberle et al. ................... 429/13 |
| 2010/0020576 A1 * | 1/2010 | Falk ................................ 363/55 |
| 2010/0043870 A1 | 2/2010 | Bennett et al. |
| 2010/0241375 A1 | 9/2010 | Kumar et al. |
| 2010/0321148 A1 | 12/2010 | Gevorkian |
| 2011/0068633 A1 | 3/2011 | Quardt et al. |
| 2011/0292705 A1 * | 12/2011 | Fornage ....................... 363/131 |
| 2012/0043818 A1 * | 2/2012 | Stratakos et al. ............... 307/77 |
| 2012/0048328 A1 | 3/2012 | Solon |
| 2012/0080943 A1 * | 4/2012 | Phadke ........................... 307/24 |
| 2012/0138123 A1 | 6/2012 | Newdoll et al. |
| 2012/0200311 A1 * | 8/2012 | Chaintreuil .............. 324/761.01 |
| 2012/0242320 A1 | 9/2012 | Fischer et al. |
| 2012/0242321 A1 | 9/2012 | Kasai et al. |
| 2012/0310427 A1 | 12/2012 | Williams et al. |
| 2013/0082724 A1 | 4/2013 | Noda et al. |
| 2013/0155736 A1 | 6/2013 | Ilic et al. |
| 2013/0321013 A1 | 12/2013 | Pisklak et al. |
| 2014/0021792 A1 | 1/2014 | Huang et al. |
| 2014/0035392 A1 | 2/2014 | Jeong et al. |
| 2014/0070619 A1 * | 3/2014 | Fornage .......................... 307/82 |
| 2014/0097705 A1 | 4/2014 | Czech et al. |
| 2014/0119083 A1 * | 5/2014 | Falk .............................. 363/123 |
| 2014/0149076 A1 | 5/2014 | Jarnason et al. |
| 2014/0168835 A1 | 6/2014 | Fornage |
| 2014/0191589 A1 | 7/2014 | Friebe et al. |
| 2014/0211530 A1 * | 7/2014 | Chen et al. ................... 363/132 |
| 2014/0225444 A1 | 8/2014 | Yoshidomi et al. |
| 2014/0239725 A1 * | 8/2014 | Easwaran et al. ............... 307/77 |
| 2014/0301003 A1 | 10/2014 | Jankowski |
| 2014/0318598 A1 | 10/2014 | Tseng |
| 2014/0347770 A1 | 11/2014 | Falk |
| 2014/0375343 A1 | 12/2014 | Chen et al. |
| 2015/0001964 A1 | 1/2015 | Duda et al. |
| 2015/0013744 A1 | 1/2015 | Kim et al. |
| 2015/0028682 A1 | 1/2015 | Jean et al. |
| 2015/0048854 A1 | 2/2015 | Fornage |
| 2015/0088440 A1 | 3/2015 | Chen et al. |

FOREIGN PATENT DOCUMENTS

| | | |
|---|---|---|
| EP | 2135296 A2 | 12/2009 |
| EP | 2351093 A1 | 8/2011 |
| EP | 2360487 A1 | 8/2011 |
| EP | 2362232 A2 | 8/2011 |
| EP | 2495577 A2 | 9/2012 |
| EP | 2634506 A1 | 9/2013 |
| EP | 2652857 A1 | 10/2013 |
| EP | 2715899 A2 | 4/2014 |
| EP | 2718916 A1 | 4/2014 |
| EP | 2742589 A2 | 6/2014 |
| EP | 2745371 A2 | 6/2014 |
| EP | 2760118 A2 | 7/2014 |
| EP | 2779250 A2 | 9/2014 |
| EP | 2779251 A1 | 9/2014 |
| EP | 2839513 A1 | 2/2015 |
| EP | 2847800 A1 | 3/2015 |
| KR | 100999978 B1 | 12/2010 |
| KR | 1020120055599 A | 5/2012 |
| KR | 101169289 B1 | 7/2012 |
| WO | WO-2010078303 A2 | 7/2010 |
| WO | WO-2012031428 A1 | 3/2012 |
| WO | WO-2012075172 A2 | 6/2012 |
| WO | WO-2014091126 A1 | 6/2014 |
| WO | WO-2014122325 A1 | 8/2014 |
| WO | WO-2015022281 A1 | 2/2015 |
| WO | WO-2015027104 A1 | 2/2015 |

OTHER PUBLICATIONS

Johnson et al., "Arc-fault detector algorithm evaluation method utilizing prerecorded arcing signatures", Photovoltaic Specialists Conference (PVSC), Jun. 2012.

* cited by examiner

SMART JUNCTION BOX FOR A PHOTOVOLTAIC SYSTEM

CROSS-REFERENCE TO RELATED APPLICATION

This Application claims priority to U.S. Provisional Patent Application No. 61/738,758 filed on Dec. 18, 2012, which is incorporated by reference herein in its entirety.

BACKGROUND OF THE INVENTION

1. Field of the Invention

Embodiments of the present disclosure generally relate to renewable energy power systems and, more particularly, to a method and apparatus providing a smart junction box in photovoltaic (PV) system.

2. Description of the Related Art

The worldwide growth of energy demand is leading to a durable increase in energy cost. In addition, it is now well established that the fossil energy reserves currently being used to generate electricity are rapidly being depleted. These growing impediments to conventional commercial power generation make solar modules a more attractive option to pursue.

Solar modules, or photovoltaic (PV) modules, convert energy from sunlight received into direct current (DC). The PV modules cannot store the electrical energy they produce, so the energy must either be dispersed to an energy storage system, such as a battery or pumped hydroelectricity storage, or dispersed by a load. One option to use the energy produced is to employ inverters to convert the DC current into an alternating current (AC) and couple the AC current to the commercial power grid. The power produced by such a distributed generation (DG) system can then be sold to the commercial power company, or used to offset local consumption of electricity by local loads.

PV modules within an array only generate equal amounts of power if exposed to a uniform amount of sunlight. However, should a single module be shaded (e.g., by a tree or cloud) or module become nonfunctioning, the power generated is inefficiently transferred and may adversely affect the shaded module. For example, the operating current of the overall series string approaches the short-circuit current of the singular shaded module and the overall current becomes limited by the shaded module. The extra current produced by the unshaded PV modules then forward biases the remaining PV modules.

If the series string is short circuited, then the forward bias across the unshaded PV modules causes a reverse bias on the shaded module. Thus a large number of series connected PV modules may cause a large reverse bias across the shaded module, leading to large dissipation of damaging power into the shaded module. Bypass diodes placed in the junction box have been used to protect the shaded PV module, however such diodes can dissipate an excess of 10 W when energized. The dissipation leads to high elevated temperatures in the junction box and possible thermal run away of the diodes.

Furthermore, continued power generation and conversion when a PV module is damaged may lead to arc faults which are extremely dangerous. The DC PV modules will continue to provide energy into a short circuit or an arcing circuit as long as the PV modules continue to be irradiated with light, potentially leading to a fire near the damaged PV module. The aforementioned dangers and necessary protective measures compound in complexity and risk as the PV module array grows in number and size.

Therefore, there is a need for a method and apparatus for a low cost, intelligent system for protecting and monitoring PV module operation.

SUMMARY OF THE INVENTION

Embodiments of the present invention generally relate to a method and apparatus providing a smart junction box in a PV power system substantially as shown in and/or described in connection with at least one of the figures, as set forth more completely in the claims.

Various advantages, aspects and novel features of the present disclosure, as well as details of an illustrated embodiment thereof, will be more fully understood from the following description and drawings.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Embodiments disclosed herein describe a method, apparatus, and system for monitoring and managing a bypass condition using a smart junction box for a photovoltaic (PV) array or module using minimal switching mechanisms. Further embodiments may include other distributed generators (e.g., wind turbines and the like) or batteries in place of the PV array.

Figure 1:
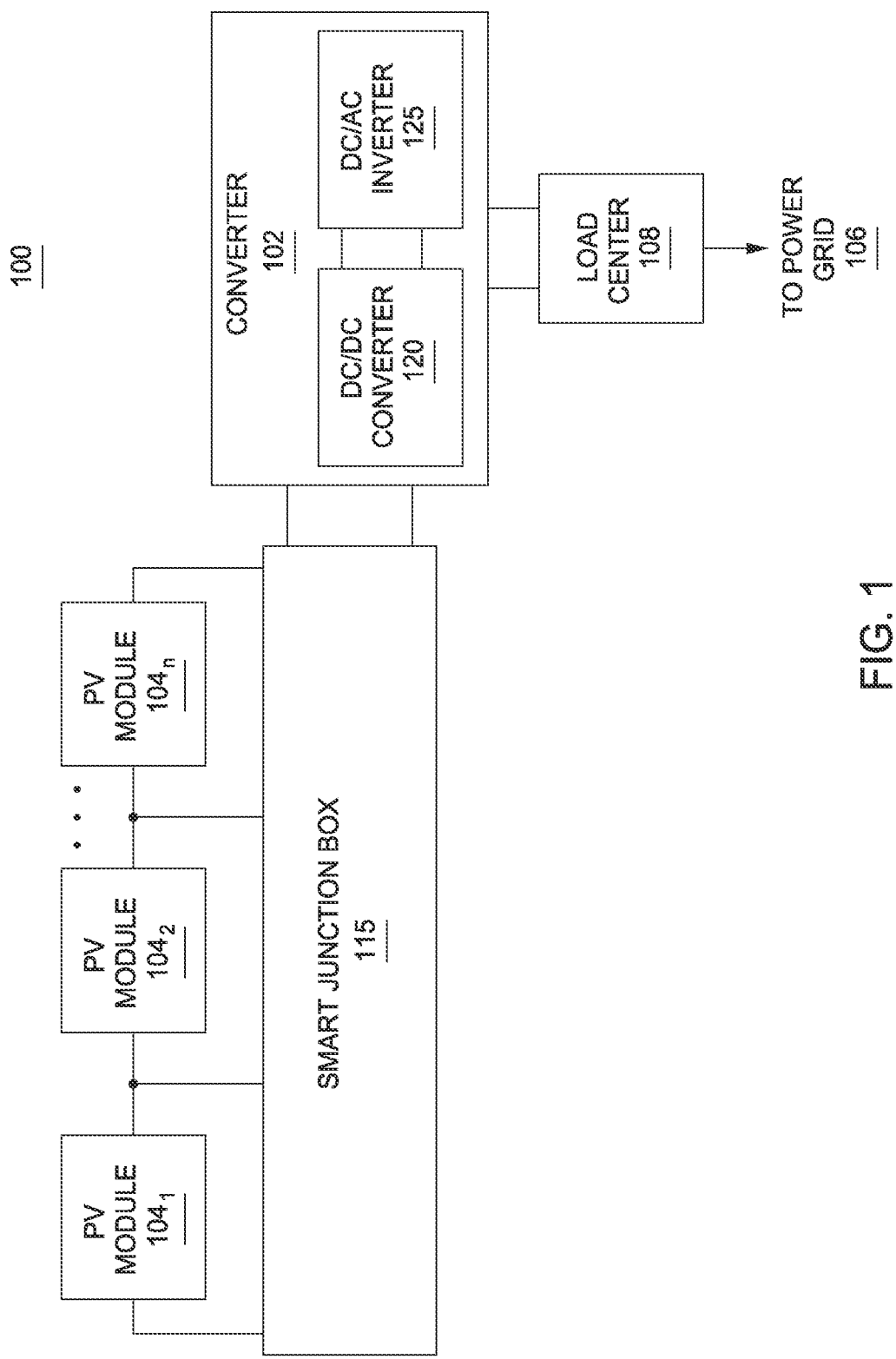
FIG. 1 is a block diagram of a system for converting solar generated DC power to AC power in accordance with one or more embodiments of the present invention.

FIG. 1 is a block diagram of a system 100 for inverting solar generated DC power to AC power in accordance with one or more embodiments of the present invention. This diagram only portrays one variation of the myriad of possible system configurations. The present invention can function in a variety of environments and systems.

The system 100 comprises a centralized power converter 102, a smart junction box 115, a plurality of PV modules $104_1$, $104_2$ ... $104_n$ (collectively referred to as PV modules 104), a load center 108, and generates power leading ultimately to an AC grid 106. The PV modules 104 are coupled to one another and to the smart junction box 115. Two output terminals of the smart junction box 115 are coupled to two output terminals of the centralized power converter 102. The system 100 utilizes a centralized converter topology wherein the power converter 102 inverts the DC power from the PV modules 104 to AC power (i.e., a centralized inverter). Alternatively, the centralized power converter 102 may be a DC/DC converter that converts the DC power generated by the PV modules 104 into DC at a different voltage. Other embodiments may comprise multiple smart junction boxes 115 or multiple converters 102 in a one-to-one correspondence or other ratio to each of the PV modules.

The power converter 102 comprises a DC/DC conversion module 120 coupled to a DC/AC inversion module 125 for inverting the DC power generated by the PV modules 104 to AC power (i.e., AC current); alternatively, a single stage converter may convert DC directly to AC. The power converter 102 is coupled to the AC grid 106, which in turn is coupled to the load center 108. In some embodiments, the load center 108 houses connections between incoming power lines from a commercial AC power grid distribution system ("grid") and the AC grid 106. Additionally or alternatively, the AC grid 106 may be provided in off-grid applications by a battery-based (or other energy storage source) inverter and/or a rotating machine generator. The power converter 102 meters out AC current that is in-phase with the AC power grid voltage, and the system 100 couples the generated AC power to the power grid via the load center 108. Additionally or alternatively, the generated AC power may be supplied directly to commercial and/or residential systems via the load center 108, and/or stored for later use (e.g., utilizing batteries, heated water, hydro pumping, $H_2O$-to-hydrogen conversion, or the like).

In some alternative embodiments, the power converter 102 may not comprise a DC/DC converter (i.e., the power converter 102 comprises a single-stage DC/AC inverter) and a separate DC/DC converter may be coupled between the smart junction box 115 and power converter 102 (i.e., one DC/DC converter per smart junction box 115/PV module 104 paired connection). In other alternative embodiments, the power converter 102 may be a DC/DC converter to convert the DC power generated by the PV modules 104 into DC at a different voltage. In such other alternative embodiments, the converted DC power from the power converters 102 may be supplied to commercial and/or residential DC systems, and/or the produced energy may be stored, for example, in storage batteries.

Figure 2:
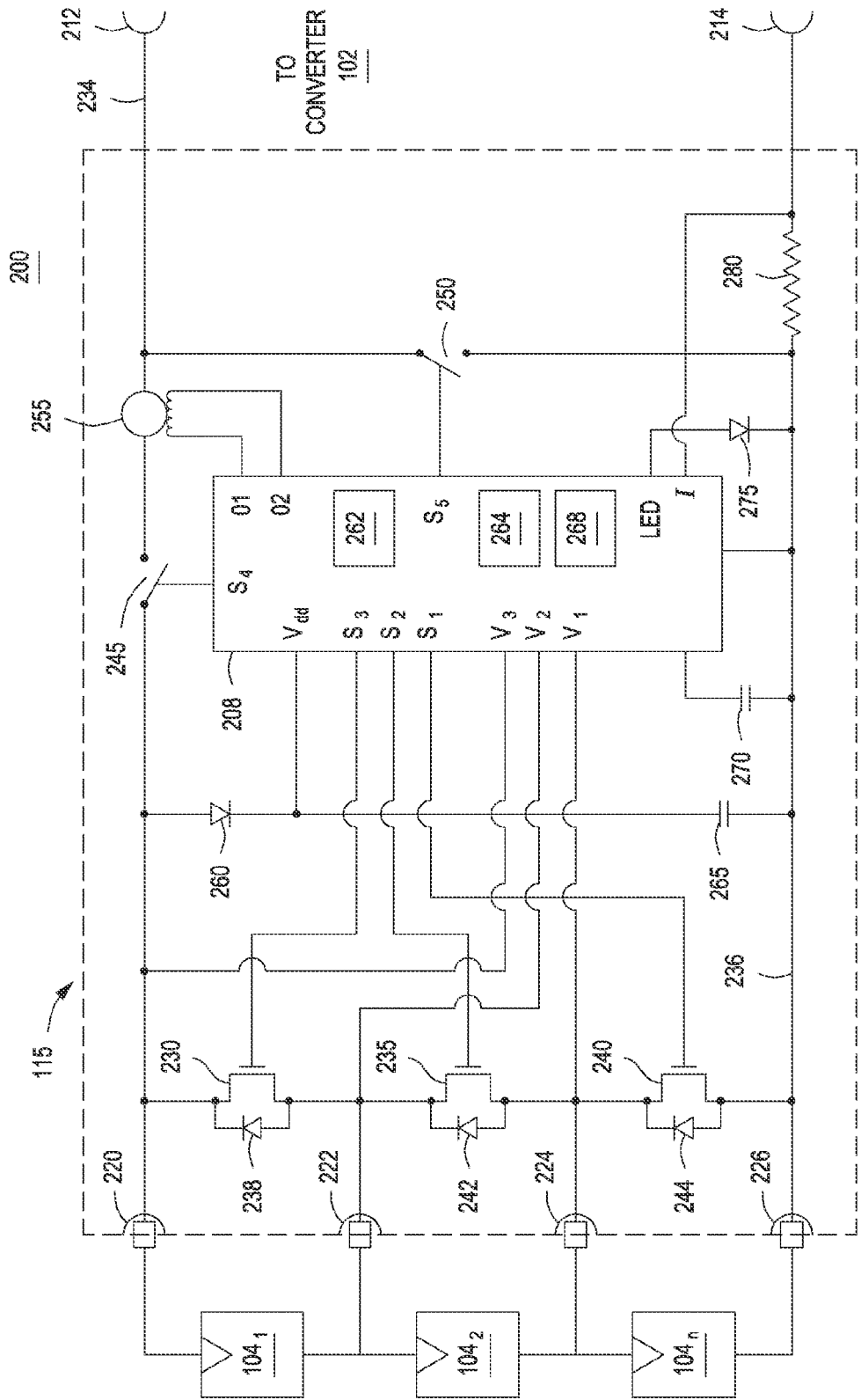
FIG. 2 is a detailed schematic of a smart junction box in accordance with one or more embodiments of the present invention.

FIG. 2 is a detailed schematic of a smart junction box 115 in accordance with one or more embodiments of the present invention. FIG. 2 includes an exemplary string of PV modules 104 as part of a larger PV array (not shown). PV modules 104 may either represent groups of cells within single PV module, or individual PV modules within a PV array. The term "PV module" is thus intended to describe both such embodiments. For example, a 60 cell module may have 6 columns of 10 cells such that $104_1$ may represent two columns. Other embodiments may include an inverter connected to an array of PV modules such that each module may have its own junction box. The embodiment in FIG. 2 has a system 200 comprising a smart junction box 115, a substring of a plurality of PV modules $104_1$, $104_2$, and $104_n$ (collectively referred to as PV modules 104), and a converter 102. Power generated by the PV modules 104 is passed through the smart junction box 115 to the converter 102 for ultimately coupling AC power to an AC grid. The exemplary embodiment of the system 200 comprises three PV modules ($104_1$, $104_2$, $104_n$), however fewer or more may be utilized. In one embodiment, the PV modules 104 are removably connected to the smart junction box 115 through input connectors (220, 222, 224, and 226) that is in turn removably connected through output connectors (212 and 214) carry DC current to the converter. Alternative embodiments include connectors that are permanently connected (e.g., crimp connected, soldered, and the like) or forego connectors for a single continuous cable.

The exemplary smart junction box 115 comprises: input connectors (220, 222, 224, and 226), "smart" bypass diode switches (230, 235, and 240), bypass diodes (238, 242, and 244), switches (245 and 250), capacitors (265 and 270), a diode 260, a LED 275, a resistor 280, a current injector circuit 255, an Integrated Circuit (IC) chip 208, and output connectors (212 and 214). In some embodiments, the smart bypass diode switches (230, 235, and 240) may be viewed as a first set of switches connected across input terminals adapted for connection to the output terminals of a plurality of photovoltaic (PV) modules and switches 245 and 250 may be viewed as a second set of switches. In other embodiments, smart bypass diode switches (230, 235, and 240) may be substituted for equivalent electrical switching mechanisms.

Input connectors (220, 222, 224, and 226) conduct power from the PV modules 104. All three smart bypass diode switches (240, 235, and 230) in this embodiment are transistors that have gates connected to and controlled by the IC chip 208 and in some embodiments may be integrated into the IC chip 208.

Connector 224 is coupled to the IC chip 208 and connector 226 is connected to a power bus 236. Connectors 224 and 226 are coupled for monitoring voltage across PV module $104_n$ and reverse current across smart bypass diode switch 240 and bypass diode 244 that are placed in parallel between connectors 226 and 224. Other embodiments may include a controller or other processor with electronic memory in place of or included on the IC chip 208.

Connector 222 is coupled for monitoring voltage and possible reverse current across PV module $104_2$ and is connected to the IC chip 208. Smart bypass diode switch 235 and bypass diode 242 are placed in parallel between connectors 224 and 222. Connector 220 is connected for monitoring voltage and possible reverse current across PV module $104_1$ and is connected to the IC chip 208 through a power bus 234. Smart bypass diode switch 230 and bypass diode 238 are placed in parallel between connectors 222 and 220.

Bypass diodes (238, 242, and 244) are across the source and drain of respective smart bypass diode switches (230, 235, and 240) comprising MOSFETs or more particularly in some embodiments, NMOS transistors. The bypass diodes (238, 242, and 244) in this configuration, shunt the current across the source and drain of the corresponding FET and protect the transistor from damage by reverse current but also indicate to the IC chip 208 the presence of a reverse current biased on the bypass diodes (238, 242, and 244). Thus, switches (240, 235, and 230) are referred to in this embodiment as "smart" bypass diode switches. In embodiments implemented with MOSFETs, bypass diodes (238, 242, and 244) may represent intrinsic body diode properties of the respective smart bypass diode switches (230, 235, 240). However, further embodiments may require actual diodes placed across the source and drain of the switching device.

The IC chip 208 is also connected to diode 260 and capacitor 265 that are connected together in series across the two power buses (234 and 236). Diode 260 forms a peak rectifier used to filter any transient voltage into the capacitor 265 that appears on the power buses (234 and 236). This voltage is measured by the IC chip 208 as Vdd. A capacitor 270 is connected between the IC chip 208 and the first power bus 236 for tracking the I/V curve operation of the PV modules 104.

Switch 245 is located in series with a current injector circuit 255 and an output connector 212 formed on the power bus 234 of the smart junction box 115. Switch 245 is the cut off switch used in case of an arc fault or in the case of a reverse bias on the individual PV modules. The current injector circuit 255 is controlled by the IC chip 208 to inject a current stimulus in order to measure the instantaneous power characteristics and may be comprised of a current measuring transformer. The resistor 280 is placed on the power bus 236 to measure output current of the smart junction box 115 using the IC chip 208. Switch 250 is placed in parallel across the two power buses (234 and 236) and is physically located closest to the output connectors (212 and 214). LED 275 is an arc fault indicator light connected to the IC chip 208 and the power bus 236.

When an arc fault occurs, an AC current going through the system 200 will be shaped with a 1/f slope. The arc fault in a signal can be detected through a Fast Fourier Transform (FFT). However, since there is noise regularly present in the system 200 from reactive circuit elements, fault detection may require identifying a signature signal that is indicative of the occurrence of an arc fault. The signature signal may be developed to disregard normal harmonics present within the system 200. In some embodiments, the signature signal is predetermined or may be dynamically determined based on instantaneous operating conditions.

Analysis of the signals may use discrete interval sampling, or bins. Exemplary embodiments may have, for example 16 bins, divided across a 320 Hz spectrum such that each bin is about 20 Hz. Higher frequencies are possible to about 20 kHz. The amplitude of each bin may be analyzed such that the slope meets a predetermined threshold. Certain bins may be removed from the FFT flatness analysis of signal amplitude, since converter 102 may generate pre-determined grid harmonics on the input (DC) port. An example of FFT analysis on noise from an inverter is discussed further below with respect in FIG. 5. If there is an arc fault condition determined, the IC chip 208 then turns off switch 245 and turns on switch 250. If the arc fault condition persists, switch 250 is turned off. The condition may be then recorded in non-volatile memory and the system 200 will not restart until the arc fault condition is resolved.

Optionally, the IC chip 208 may contain one or more of a GPS receiver 262, RFID 264, or a communication transceiver 268. The GPS receiver 262 could provide the geo location of the smart junction box 115 for inventory management and theft protection. If the smart junction box 115 is detachable, the RFID 264 can be embedded in the IC for identification and improve inventory management. The communication transceiver 268 allows power line communications wherein the IC chip 208 is able to communicate with external electronics through the output connectors 212 and 214. In alternative embodiments, the IC chip 208 may be modified to include wireless RF communication topology. In such embodiments, a communication system (not shown) is configured to communicate with the IC chip 208 and/or the smart junction box 115. In addition to wireless communication, other embodiments may include hard wire network communications, cellular network communications, power line communications, and the like.

Figure 3:
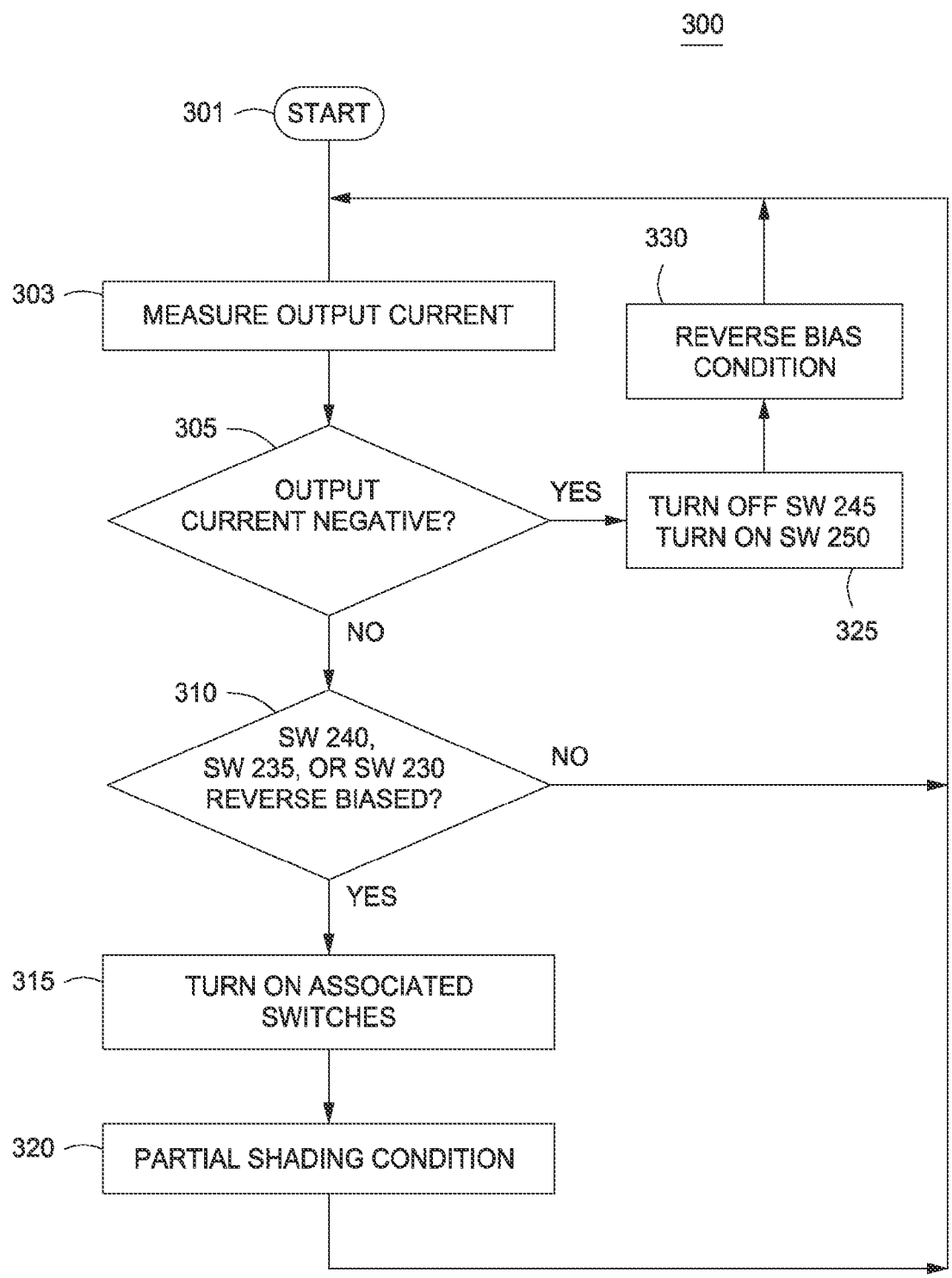
FIG. 3 is a flow diagram of managing a bypass condition in accordance with one or more embodiments of the present invention.

FIG. 3 is a flow diagram of a method 300 managing a bypass condition for the smart junction box 115. The method 300 in some embodiments may be implemented by the IC chip 208 and the smart junction box 115. Switches described herein are of an exemplary topology for managing a bypass condition of a PV module (e.g., a shading condition) however, other distributed generator or power source may be applied such as a wind turbine or battery. Other embodiments may include detection of unexpected or undesirable operating conditions such as an arc fault, disconnection of a PV module, PV module failure, disconnection for maintenance, and the like.

The method 300 begins at step 301 and continues to step 303. The output current of the smart junction box 115 is measured by a current measuring device (e.g., via current injection circuit 255 and/or measuring transformer) at step 303. If, at step 305, output current is determined to be negative, the IC chip 208 will open/turn off switch 245 and close/turn on switch 250 at step 325. Turning off switch 245 disconnects the power bus 234 and turning on switch 250 short circuits the output connectors 212 and 214 to substantially bypass the smart junction box 115 and ultimately, the associated group of connected PV modules. Step 325 leads to step 330 declaring a reverse bias condition exists for the smart junction box 115 and the method 300 restarts.

However, if at step 305, the method 300 determines the output current is not negative, the method 300 continues to step 310 to determine if smart bypass diode switches (240, 235, and 230) have reverse current across corresponding bypass diodes (244, 242, and 238) using IC chip 208. Reverse current on the smart bypass diode switches (240, 235, and 230) indicate a possible reverse current across a particular PV module. It should be noted, that when smart bypass diode switches (240, 235, and 230) are consistently in a closed/on position, it may be necessary to periodically turn the switches off to accurately confirm the presence of a reverse current on the smart diode switches 240, 235 and 230 during measurement periods.

If at step 310, the method 300 determines there is no reverse current on a smart bypass diode switch (240, 235, and 230), then the method 300 restarts. However, if at step 310, the method 300 determines there is a reverse current across a smart bypass diode switch, the diode with reverse current has its associated switch turned on at step 315. For example, if a reverse current is detected at connector 222 and pin V2 of the IC chip 208, a signal S2 is sent to close switch 235 to bypass the second PV module $104_2$. In other embodiments, more than one smart bypass diode switch may be closed to reflect shading of multiple PV modules and subsequent bypass of such modules.

Lastly, with the reverse current detected, the IC chip 208 indicates at step 320 a partial shading condition (or other performance impacting condition) has been detected and in some embodiments may communicate this status offsite via communication modules in the IC chip 208. In other embodiments, the shading condition detection may also determine modifying other variables such as maximum power point tracking (MPPT) and/or monitoring within the system 100. The method 300 then continues measuring output current at step 303.

Figure 4:
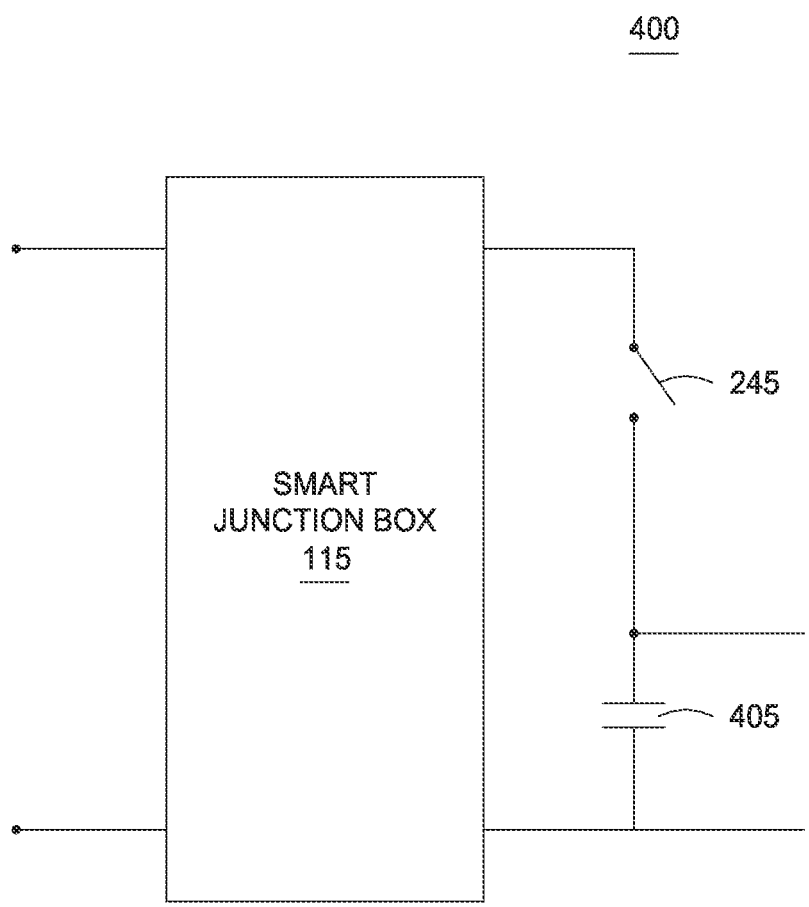
FIG. 4 is an exemplary schematic for effectively measuring an I/V characteristic after the smart junction box is disconnected from the PV power system in accordance with one or more embodiments of the present invention.

FIG. 4 is an exemplary schematic for effectively measuring an IN characteristic after the smart junction box is disconnected from the PV conversion system. The I/V characteristic is tracked by the IC chip 208, and in further embodiments, may communicate the results to electronic memory and/or external circuitry. FIG. 4 depicts a configured circuit 400 of essentially how the junction box is viewed from the output perspective. Based on the output perspective of the circuit 400, a measurement of the I/V characteristic curve of the smart junction box 115 is still possible even when taken out of service.

To begin measurement, a discharge capacitor 405 is connected to the output terminals (212 and 214) of the smart junction box 115. Then by turning switch 245 off, it is possible to plot I=f(v) by inferring $$I = \frac{Cdv_c}{dt}.$$

An exemplary plot is discussed further below with respect to FIGS. 6A and 6B. $V_c$ representing the charge of the load capacitor 405 having a capacitance value C. Voltage can then be measured on each PV module substring at the same time and each substring I/V characteristic can be derived. The value of capacitor 405 can be calibrated at the time of manufacturing for specific capacitor types, applications, and the like.

Figure 5:
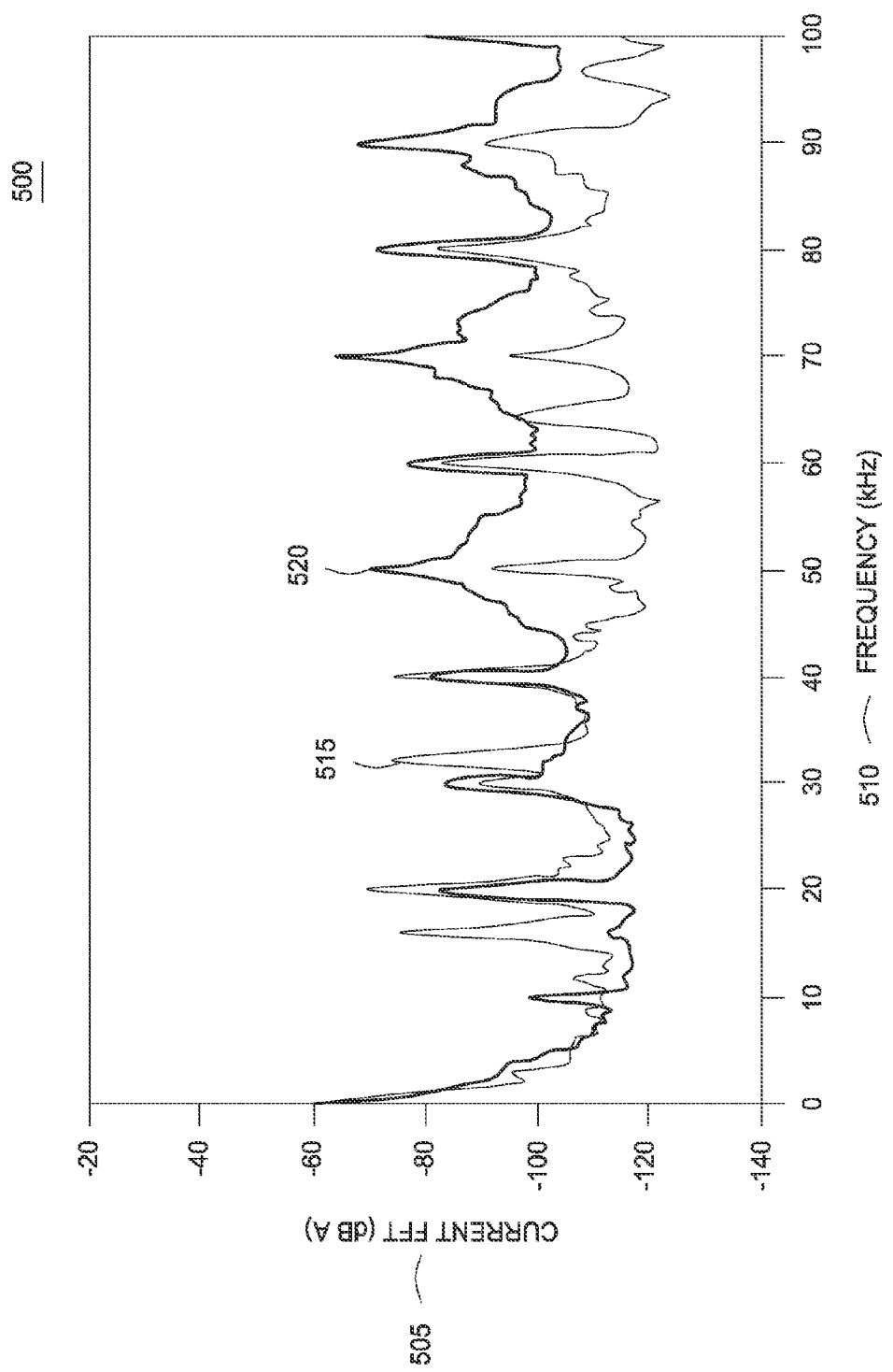
FIG. 5 is an exemplary graph of inverter noise signatures in accordance with one or more embodiments of the present invention.

FIG. 5 is an exemplary graph 500 of inverter noise signatures in accordance with one or more embodiments of the present invention. The graph 500 is a plot of signals of current 505 versus frequency 510. The signals include a first exemplary noise curve 515 and a second exemplary noise curve 520. The respective curves representing noise signatures from two different inverters. A FFT was performed with a Hanning window on $2^{18}$ DC current data samples captured at 10 MHz to produce curves (515, 520) that were smoothed with an 800 Hz sliding window. Using the captured noise signatures, arc fault detection accuracy is increased as the data can be compared to real-time operating conditions leading to less false-positive (i.e., erroneous) fault conditions.

In some embodiments, from the exemplary graph 500, the flatness of the curve(s) is then compared with the 1/f curve corresponding to pink noise, which indicates whether an arc fault condition will be declared by the IC chip 208. Pink noise or "flicker noise" is a signal or process with a frequency spectrum such that the power spectral density (energy or power per Hz) is inversely proportional to the frequency. If there is an arc fault condition determined, the IC chip 208 then turns off switch 245 and turns on switch 250. If the arc fault condition persists, switch 250 is turned off. The condition may be then recorded in non-volatile memory and the system 200 will not restart until the arc fault condition is resolved. In some embodiments, the noise is present from artifacts of power conversion, be it DC-DC or DC-AC conversion generated by power conversion equipment such as inverters.

Figure 6A:
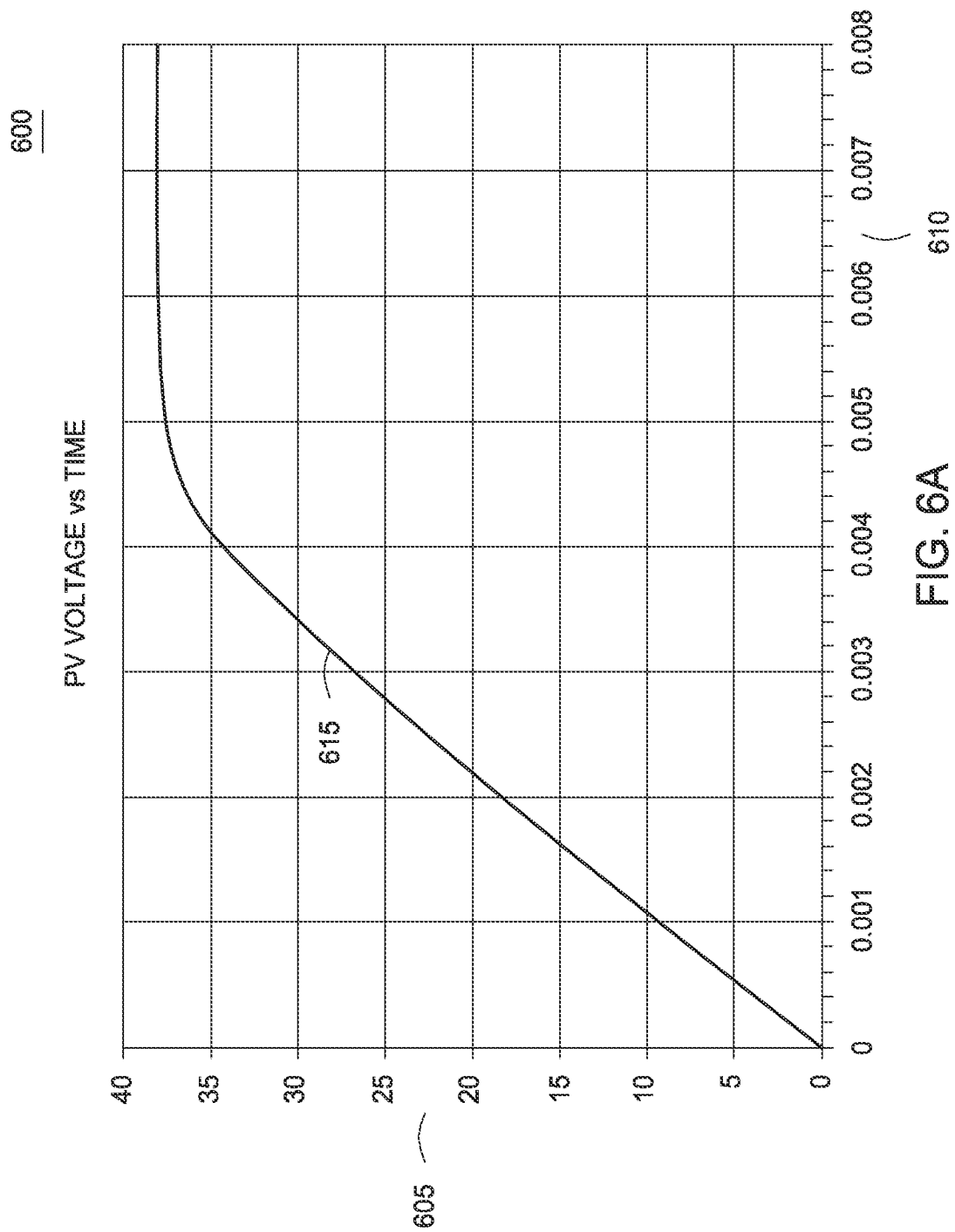
FIGS. 6A and 6B are exemplary graphs of capacitor charging in accordance with one or more embodiments of the present invention.
Figure 6B:
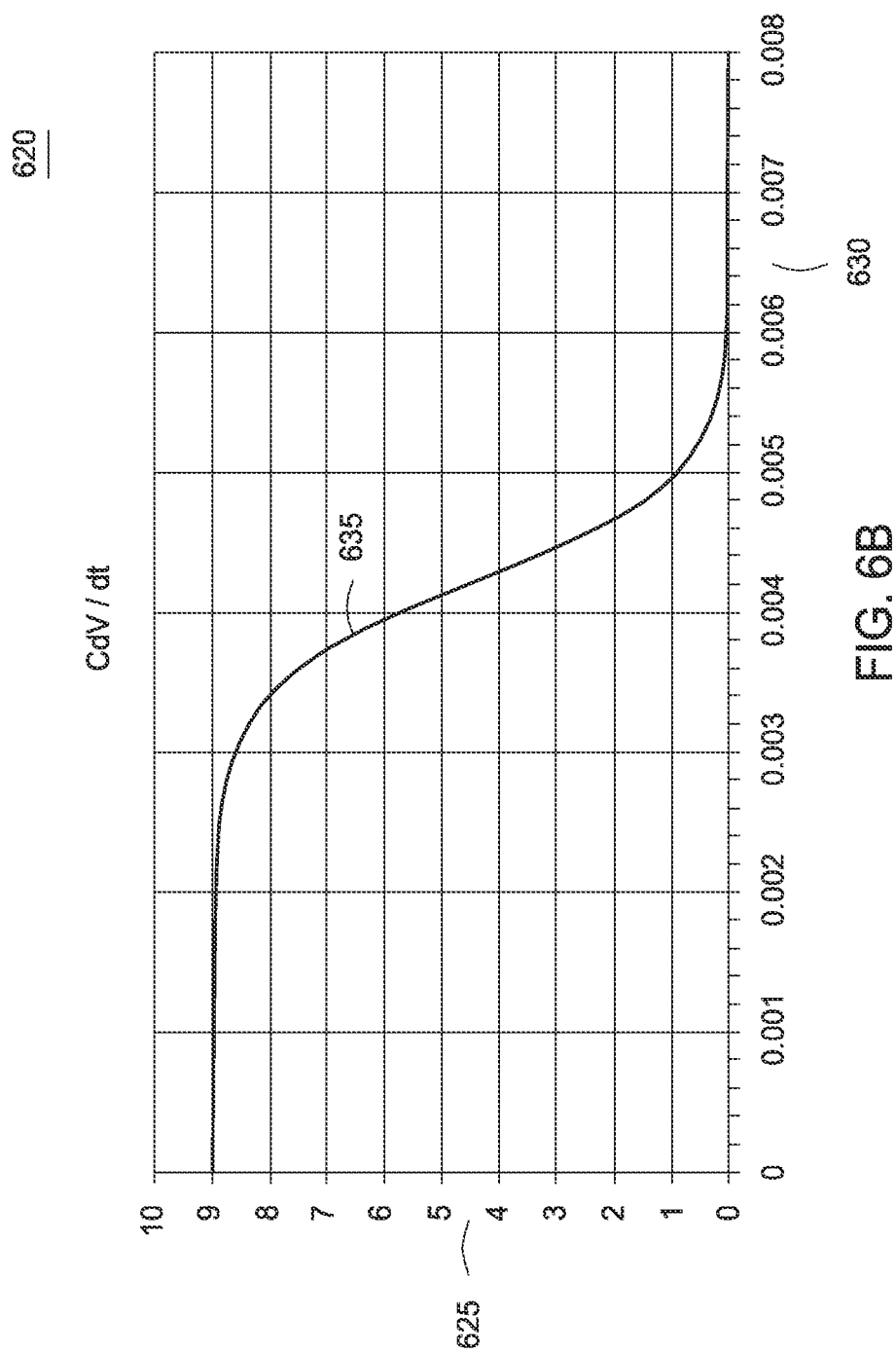

FIGS. 6A and 6B are exemplary graphs with data for capacitor charging in accordance with one or more embodiments of the present invention. FIG. 6A is a graph 600 of a charging curve 615 of a capacitor (e.g., discharge capacitor 405) against voltage 605 versus time 610 (in seconds). In this exemplary embodiment, the capacitor is 1000 microfarads (µF), however, other sizes may be used (e.g., 10 µF) as well as different time resolutions (e.g., 10 µs).

FIG. 6B is a graph 620 of current 625 versus time 630. From a curve 635, current I may be determined and subsequently correlated with the voltage V from curve 615. I and V are correlated together to determine I=f(V). In other words, for each time sample, the pair V, I data are recorded and plotted to form the curve I(V). Thus it is possible to plot I=f(v) by inferring $$I = \frac{Cdv_c}{dt}.$$

The foregoing description of embodiments of the invention comprises a number of elements, devices, circuits and/or assemblies that perform various functions as described. These elements, devices, circuits, and/or assemblies are exemplary implementations of means for performing their respectively described functions.

While the foregoing is directed to embodiments of the present invention, other and further embodiments of the invention may be devised without departing from the basic scope thereof, and the scope thereof is determined by the claims that follow.

The invention claimed is:

1. An apparatus for a smart junction box comprising:
    a first set of switches connected across input terminals adapted for connection to output terminals of a plurality of photovoltatic (PV) modules;
    a plurality of diodes connected across input terminals of each respective switch in the first set of switches;
    at least one reverse current detection device on at least one output terminal of the smart junction box;
    a second set of switches to selectively disconnect and short circuit output terminals of the smart junction box when a reverse current is detected, and wherein at least one switch of the second set of switches is located across the output terminals; and
    a controller controlling the first and second set of switches.

2. The apparatus of claim 1, wherein the input terminals correspond to detachable connectors for coupling to parallel connections across the plurality of PV modules.

3. The apparatus of claim 2, wherein at least one switch of the first set of switches are each coupled in parallel across each PV module.

4. The apparatus of claim 1, wherein the controller detects a reverse current at the input terminals.

5. The apparatus of claim 4, wherein the controller closes at least one switch of the first set of switches to electrically bypass a corresponding PV module.

6. The apparatus of claim 1, wherein upon detection of a reverse current, the controller communicates a notification via a communication module.

7. The apparatus of claim 1, wherein the reverse current detection device injects a stimulus current.

8. A system for a smart junction box:
    a plurality of photovoltaic (PV) modules;
    a power converter;
    a smart junction box, the smart junction box coupled between the plurality of PV modules and the power converter, wherein the smart junction box comprises:
        a first set of switches connected across input terminals adapted for connection to output terminals of the plurality of PV modules;
        a plurality of diodes connected across input terminals of each respective switch in the first set of switches;
        at least one reverse current detection device on at least one output terminal of the smart junction box;
        a second set of switches to selectively disconnect and short circuit output terminals of the smart junction box when a reverse current is detected, and wherein at least one switch of the second set of switches is located across the output terminals; and
        a controller controlling the first and second set of switches.

9. The system of claim 8, wherein the input terminals correspond to detachable connectors for coupling to parallel connections across the plurality of PV modules.

10. The system of claim 9, wherein at least one switch of the first set of switches are each coupled in parallel across each PV module.

11. The system of claim 8, wherein the controller detects a reverse current at the input terminals.

12. The system of claim 11, wherein the controller closes at least one switch of the first set of switches to electrically bypass a corresponding PV module.

13. The system of claim 8, wherein upon detection of a reverse current, the controller communicates a notification via a communication module.

14. The system of claim 8, wherein the reverse current detection device injects a stimulus current.

15. A method of electrical bypass using a smart junction box comprising:
   coupling a smart junction box across output terminals of a plurality of photovoltaic (PV) modules;
   monitoring input current across input terminals adapted for connection to the output terminals of the plurality of PV modules;
   controlling via a controller a first and second set of switches;
   selectively controlling the first set of switches coupled across the input terminals, and a plurality of diodes connected across input terminals of each respective switch in the first set of switches;
   measuring reverse current with at least one current measurement device on at least one output terminal of the smart junction box; and
   controlling a second set of switches to selectively disconnect and short circuit output terminals of the smart junction box, wherein at least one switch of the second set of switches is located across the output terminals.

16. The method of claim 15, wherein the input terminals correspond to detachable connectors for coupling to parallel connections across the plurality of PV modules.

17. The method of claim 16, wherein at least one switch of the first set of switches are each coupled in parallel across each PV module of the plurality of PV modules.

18. The method of claim 17, further comprising detecting a reverse current at the input terminals.

19. The method of claim 18, closing at least one switch of the first set of switches to electrically bypass the corresponding PV module when a reverse current is detected at the input terminals.

20. The method of claim 15, further comprising injecting a stimulus current to detect a presence of a reverse current.

\* \* \* \* \*